United States Patent
Siddiqui et al.

(10) Patent No.: US 6,788,083 B1
(45) Date of Patent: Sep. 7, 2004

(54) METHOD AND APPARATUS TO PROVIDE A BURN-IN BOARD WITH INCREASED MONITORING CAPACITY

(75) Inventors: Shakeel M. Siddiqui, Santa Clara, CA (US); Vadim Tymofyeyev, Santa Clara, CA (US)

(73) Assignee: Pycon, Inc., Santa Clara, CA (US)

( * ) Notice: Subject to any disclaimer, the term of this patent is extended or adjusted under 35 U.S.C. 154(b) by 0 days.

(21) Appl. No.: 10/143,592

(22) Filed: May 9, 2002

(51) Int. Cl.$^7$ ............................................. G01R 31/02
(52) U.S. Cl. ...................................................... 324/760
(58) Field of Search ................................ 324/760, 763, 324/158.1, 754, 765

(56) References Cited

U.S. PATENT DOCUMENTS

| | | |
|---|---|---|
| 4,145,620 A | 3/1979 | Dice |
| 4,374,317 A | 2/1983 | Bradshaw |
| 4,417,295 A | 11/1983 | Stuckert |
| 4,468,616 A | 8/1984 | Yoshizaki |

(List continued on next page.)

OTHER PUBLICATIONS

Hamilton, et al., "High–Power burn–In for VLSI Devices", Micro Control Company, 1997, pp. 1–11.

Hansen, et al., "Air jet impengement heat transfer from modified surfaces", Intl. J. Heat Mass Transfer, vol. 36, No. 4, pp. 989–997, 1993.

Lee, et al., "Constriction/Spreading Resistance Model For Electronics Packaging", ASME/JSME Thermal Engineering Conference: vol. 4, ASME, 1995, pp. 199–206.

Hansen & B.W. Webb, Intl. J. Heat Mass. Transfer, vol. 36, No. 4, pp. 989–997, 1993.

*Primary Examiner*—Evan Pert
*Assistant Examiner*—Tung X. Nguyen
(74) *Attorney, Agent, or Firm*—Blakely, Sokoloff, Taylor & Zafman LLP

(57) ABSTRACT

A method and apparatus are described for allowing the testing and monitoring of an increased number of device on a standard burn-in board by implementing a PLD and a group of switches to get the result of a multiplexor on the burn-in board. The test data output (TDO) signals from the integrated circuit devices are segmented into groups, with each group of TDO signals transmitted to a particular group of switches. A programmable logic device is coupled to the groups of switches such that a specific group of switches may be selected to transmit the TDO signals of the selected group of switches. The remaining groups of switches are selected, in turn, until all of the TDO signals have been transmitted. Thus, the TDO signals from an increased number of integrated circuit devices may be transmitted, serially, via a limited number of monitoring channels.

16 Claims, 5 Drawing Sheets

U.S. PATENT DOCUMENTS

| | | |
|---|---|---|
| 4,636,725 A | 1/1987 | Santomango et al. |
| 4,683,424 A | 7/1987 | Cutright et al. |
| 4,746,855 A | 5/1988 | Wrinn |
| 4,902,969 A | 2/1990 | Gussman |
| 4,947,545 A | 8/1990 | Gussman |
| 4,949,031 A | 8/1990 | Szasz et al. |
| 4,956,602 A | 9/1990 | Parrish |
| 5,003,156 A | 3/1991 | Kilpatrick et al. |
| 5,083,194 A | 1/1992 | Bartilson |
| 5,093,982 A | 3/1992 | Gussman |
| 5,103,168 A | 4/1992 | Fuoco |
| 5,126,656 A | 6/1992 | Jones |
| 5,164,661 A | 11/1992 | Jones |
| 5,191,282 A | 3/1993 | Liken et al. |
| 5,254,839 A | 10/1993 | Laine |
| 5,270,572 A | 12/1993 | Nakajima et al. |
| 5,397,998 A | 3/1995 | Soeno et al. |
| 5,402,078 A | 3/1995 | Hamilton |
| 5,420,521 A | 5/1995 | Jones |
| 5,429,510 A | 7/1995 | Barraclough et al. |
| 5,515,910 A | 5/1996 | Hamilton et al. |
| 5,528,161 A | 6/1996 | Liken et al. |
| 5,543,727 A | 8/1996 | Bushard et al. |
| 5,579,826 A | 12/1996 | Hamilton et al. |
| 5,582,235 A | 12/1996 | Hamilton et al. |
| 5,695,359 A | 12/1997 | Fujikura et al. |
| 5,796,246 A | 8/1998 | Poh et al. |
| 5,880,592 A | 3/1999 | Sharpes et al. |
| 5,911,897 A | 6/1999 | Hamilton |
| 5,966,021 A * | 10/1999 | Eliashberg et al. ......... 324/760 |
| 6,127,834 A | 10/2000 | Eliashberg et al. |
| 6,160,411 A | 12/2000 | Eliashberg et al. |
| 6,262,588 B1 * | 7/2001 | Chen ......................... 324/765 |

* cited by examiner

METHOD AND APPARATUS TO PROVIDE A BURN-IN BOARD WITH INCREASED MONITORING CAPACITY

FIELD

Embodiments of the present invention relate to high and low temperature testing of integrated circuits. More particularly, embodiments relate to increasing the number of devices to be tested with monitoring on standard size burn-in boards a limited number of available I/O channels.

BACKGROUND

Integrated circuit (IC) devices are typically tested after manufacture by sending electrical signals to the devices while the devices are in an elevated temperature for a period of time. Devices that fail to operate normally during such electrical stressing can be discarded, and it can be determined under what temperatures a device of a certain type be expected to reliably operate. This process is referred to as burn-in. Multiple integrated circuit chips are placed on a burn-in board ("BIB") that is similar to a computer add-on card, but typically larger. The BIB is a printed circuit board with receptacles for the IC devices. The BIB also includes printed circuit connections between pins of the IC chips and connectors of the BIB.

FIG. 1 is a block diagram of a typical prior art burn-in system. System 100 includes BIB 105. BIB 105 includes a number of devices under test (DUTs) 110. In typical testing applications, the BIB is placed in a burn-in oven chamber to subject the DUTs 110 to high temperature cycles. BIB 105 is electrically connected to responsive driver board 115. Driver board 115 contains electronics 120 including traces for power, ground, and control signals to be propagated to BIB 105. Driver board 115 has a fixed number of channels (trace that carries an electrical signal) 125. Some of the channels 125 are used for ground channels, supply voltage, and high frequency clocks. The remaining channels are used to transmit data between the driver board 115 and the DUTS 110 on BIB 105. The driver board 115 uses some channels to drive control signals to the DUTs 110 and uses others to monitor (read) the response of each DUT (test data output ("TDO") signal) to determine if the DUT is failing or passing. Electronics 120 also contain firmware that controls the routing of each channel to determine if the channel is used for driving or monitoring. The driver board typically also contains firmware with the expected response values and can compare these values to the actual received TDO signal for each DUT. The driver board may then forward the failing/passing data to a processing system (not shown) that contains user interface software.

FIG. 2 is a perspective view of a prior art burn-in system 100. Backplane board 130 provides thermal insulation between the BIB 105 that goes into the hot chamber and the driver board 115 that does not. Backplane board 130 contains connector sets 135 and 140. Connector set 135 connects to connector set 136 of BIB 105 and connector set 140 connects to connector set 141 of driver board 115. In backplane board 130, connector set 135 directly connects to connector set 140 providing electrical channels 125 (not shown). Backplane board 130 may also contain additional connector sets such as connector sets 150 and 151 for interfacing additional BIB/driver board pairs.

The number of channels 125 limits the number of DUTs 110 that may be tested with monitoring on BIB 105 at a time. This limitation is not apparent when the control signals are being written to the DUTs 110 because when the DUTs 110 are receiving data it is practical to make their input channels common (i.e., the input pins are connected in parallel). Monitoring the output, however, requires each DUT to be on its own channel. For example, a number of channels may be needed to drive the control signals from the driver board 115 to the DUTs 110. This number is a fixed value regardless of how many DUTs are on the BIB 105. Each of the remaining channels may used to monitor a DUT—i.e., receive the TDO signal from a DUT. For example, a system having 72 channels, 21 channels may be used as ground channels, supply voltage, and high frequency clocks, leaving 51 channels available. Of these, 30 channels, for example, may be used to drive the control signals (of course the number of channels required to drive the control signals depends on the device to be tested and the test to be conducted). With 21 monitoring channels available to receive the TDO signal, the maximum number of DUTs that can be tested at a time is 21. This does not present a problem for larger, more expensive, IC devices (e.g., some microprocessors) because their size may limit the number that can be tested at one time in any case. For example, BIBs are typically of a standard size and the number of a certain type of IC device that can fit on the BIB may be less than the number of available channels for receiving the TDO signal. Moreover, relatively expensive devices may more easily absorb the costs of testing. The problem is evident for smaller, less expensive IC devices (e.g., ASICs and custom ICs) where more devices could fit on the BIB and the limited throughput adds significantly to the unit cost.

SUMMARY

An embodiment of the present invention provides a burn-in board coupled to a plurality of integrated circuit devices. Each integrated circuit device has a test data output signal associated with it. The burn-in board has a plurality of monitoring channels to transmit the test data output signals. A set of group of switches is implemented on the burn-in board. Each group of switches is coupled to a corresponding portion of the plurality of integrated circuit devices. Each group of switches receives test data output signals associated with the portion of the plurality of integrated circuit devices corresponding to that multiplexor. A programmable logic device is coupled to the set of multiplexors such that a specific multiplexor may be selected to transmit the test data output signals associated with the portion of the plurality of integrated circuit devices corresponding to the selected multiplexor. The test data output signals are transmitted via the plurality of monitoring channels.

Other features and advantages of the present invention will be apparent from the accompanying drawings, and from the detailed description, that follows below.

BRIEF DESCRIPTION OF THE DRAWINGS

The present invention illustrated by way of example, and not limitation, by the figures of the drawings in which like references indicate similar elements in which.

DETAILED DESCRIPTION

An embodiment of the present invention provides a method and apparatus for allowing the testing and monitoring of an increased number of devices on a standard burn-in-board (BIB) as compared to the available I/O channels by implementing a multiplexor (MUX) on the BIB. The MUX is used to select a group test data output (TDO) signals from the total. The available monitoring channels are then used to transmit the selected group of TDO signals from a particular group of DUTs, and another group of TDO signals from another group of DUTs is then selected.

An intended advantage of embodiments of the present invention is to provide an increased capacity BIB compatible with existing burn-in systems. Another intended advantage is to provide a cost-effective increased capacity BIB. Another intended advantage is to implement MUX circuitry on a BIB capable of performance at oven temperatures of approximately 115° centigrade (C) to 125° C. Another intended advantage is to provide a mechanism for cooling MUX circuitry located on a BIB.

Figure 1:
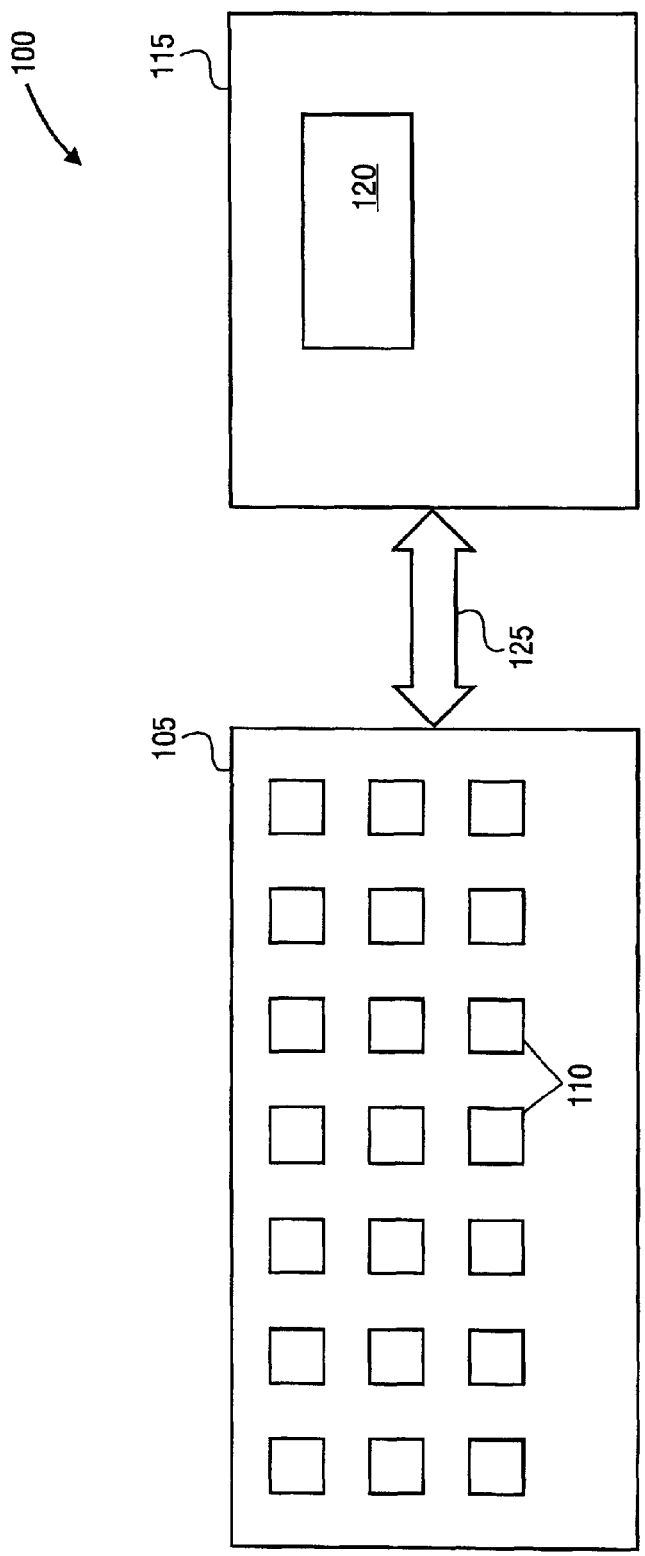
FIG. 1 is a block diagram of a typical prior art burn-in system.
Figure 2:
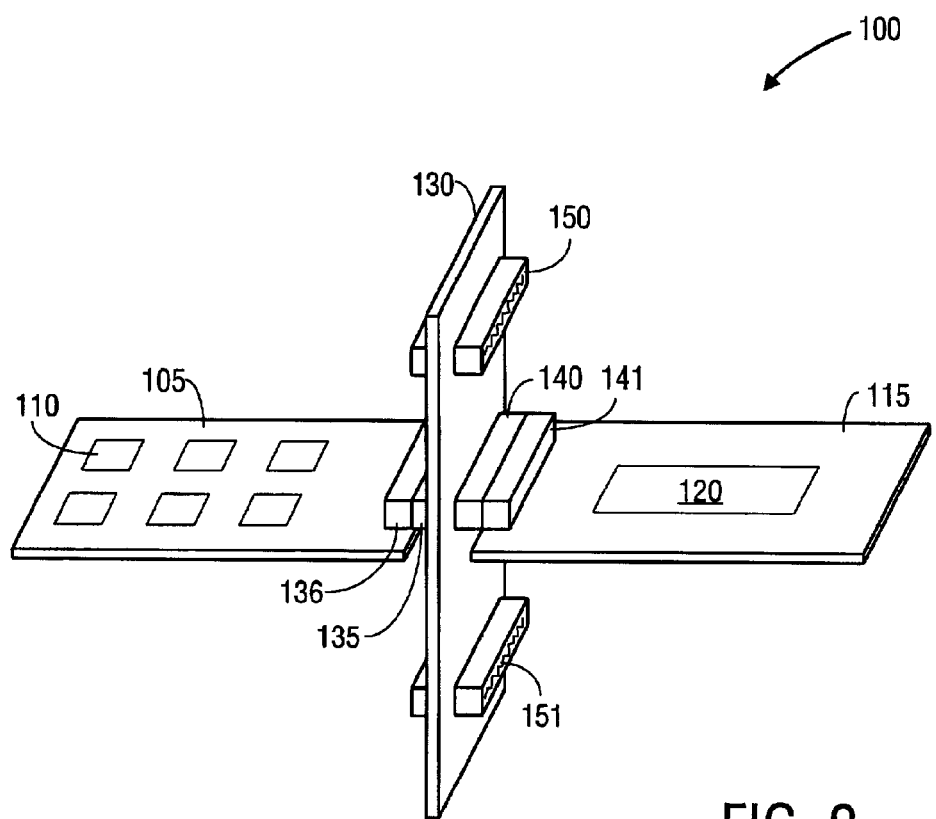
FIG. 2 is a perspective view of a prior art burn-in system.
Figure 3:
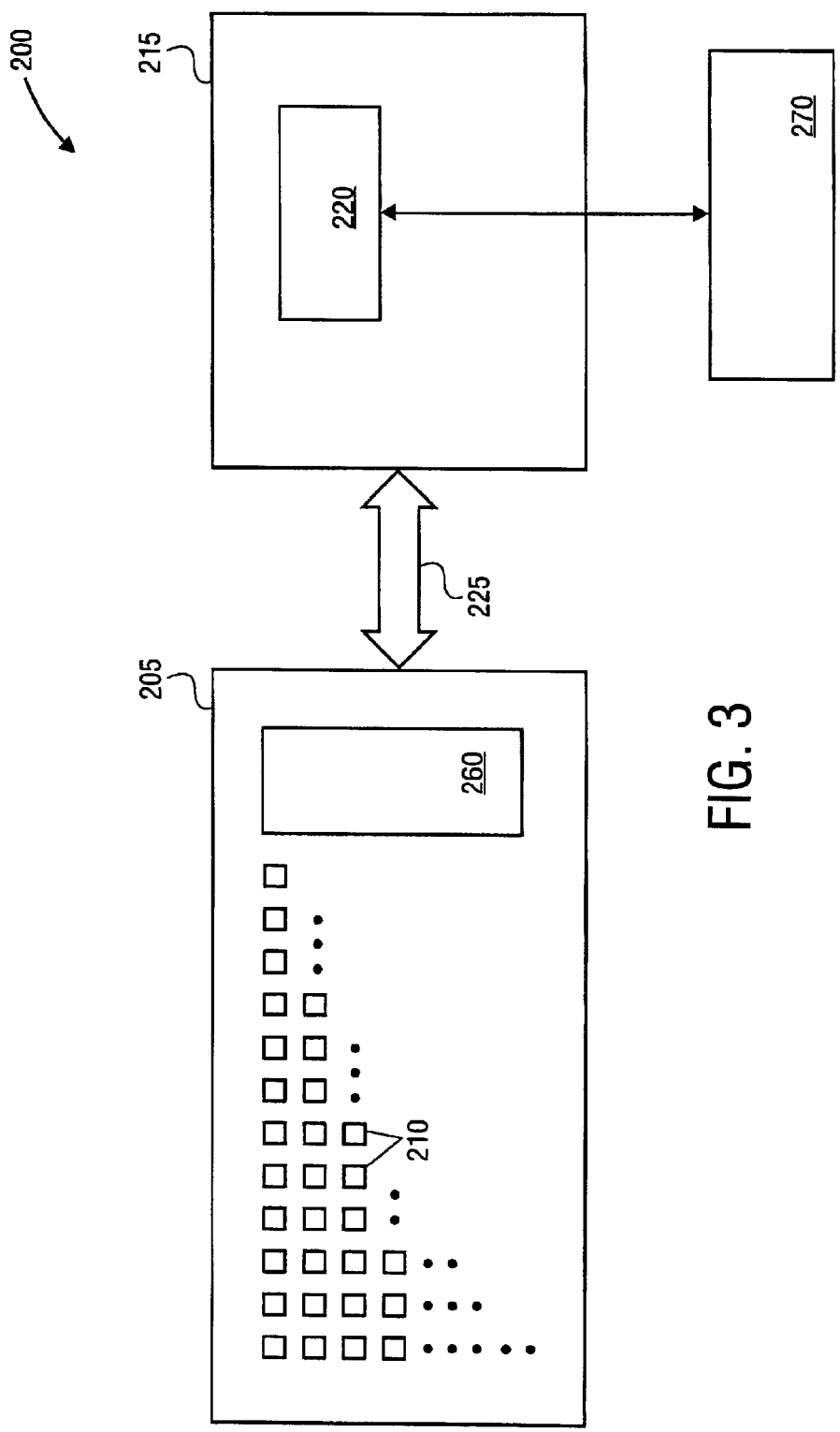
FIG. 3 is a block diagram of a burn-in system in accordance with one embodiment of the invention.

FIG. 3 is a block diagram of a burn-in system in accordance with one embodiment of the present invention. System 200 includes BIB 205 having a number of DUTs 210 thereon. BIB 205 also includes multiplexing circuitry 260. For one embodiment, MUX circuitry 260 may be implemented as bus multiplexor based on multiple high temperature (approximately 115° C. to 125° C.) switches, for example, four channel analog switch model number DG406AK available from Vishay Intertechnology Inc. of Malvern, Pa. Alternatively, low temperature (approximately 80° C.) switches may be used to reduce costs when the particular application allows. For example, a particular application may require only low temperature testing, or a particular system may have a cooling mechanism within the burn-in oven itself to cool the MUX circuitry. In such cases high temperature components may not be necessary. Additionally, a heat sink may be coupled to the switches to provide cooling and may eliminate the need for high temperature switches.

MUX circuitry 260 allows a portion of DUTS 210 to be selected and the TDO signal from that group transmitted over available output channels. For example, if the number of DUTS 210 is 100, the 100 TDO signals may be divided into groups of 16 TDO signals. When a particular group is selected, only 16 of the channels 225 are required to transmit the TDO signal of each DUT to the driver board 215 for analysis by firmware 220. Each group may be selected, in-turn, so that all 100 TDO signals may be monitored over the 16 channels. Monitoring the TDO signals 16 at a time may prolong the data read back process, but only negligibly (e.g., microseconds). An additional four channels may be used to transmit control signals in order to select a particular group of 16 TDO signals. Thus, the number of channels necessary to transmit the TDO signals from 100 DUTs is only 20. For a typical existing burn-in systems such as those using a Reliability Criteria 18® burn-in oven from Reliability Incorporated of Houston, Tex., the driver board used may be Universal Burn-In Driver 2.2 (UBID 2.2) which has 72 channels, with 51 channels available to transmit data between the driver board 215 and the BIB. 205. In accordance with an embodiment of the present invention, electronics 220 may use 30 of those channels to propagate (write) data to the DUTs 210. The remaining 21 channels are used to monitor the TDO signal of each of the 100 DUTs. Thus, the number of DUTs 210 that may be tested on BIB 205 is not limited by the number of channels 225.

System 200 also includes a processing system 270, that may be, for example, a general-purpose computer, or portable computer. The processing system 270 provides a user interface to allow a user to select test procedures and access test results. The processing system receives test result data from the electronics 220 located on driver board 215. In accordance with one embodiment of the present invention, host software, located on processing system 270, is modified to accommodate test result data for 100 DUTs, for example.

The supply voltage may be 10–15 volts while the programmable logic device only requires 5 volt. To address the problem of power fluctuation, system 200 may include a step-down power supply to provide power to the PLD and also control noise level. For example, a MAX738AMJA DC-DC step-down converter available from Maxim Integrated Products Inc. of Sunnyvale Calif. may be used for high temperature applications. As noted above, less expensive (low temperature) devices may be used for low temperature applications or in conjunction with other cooling mechanisms.

Figure 4:
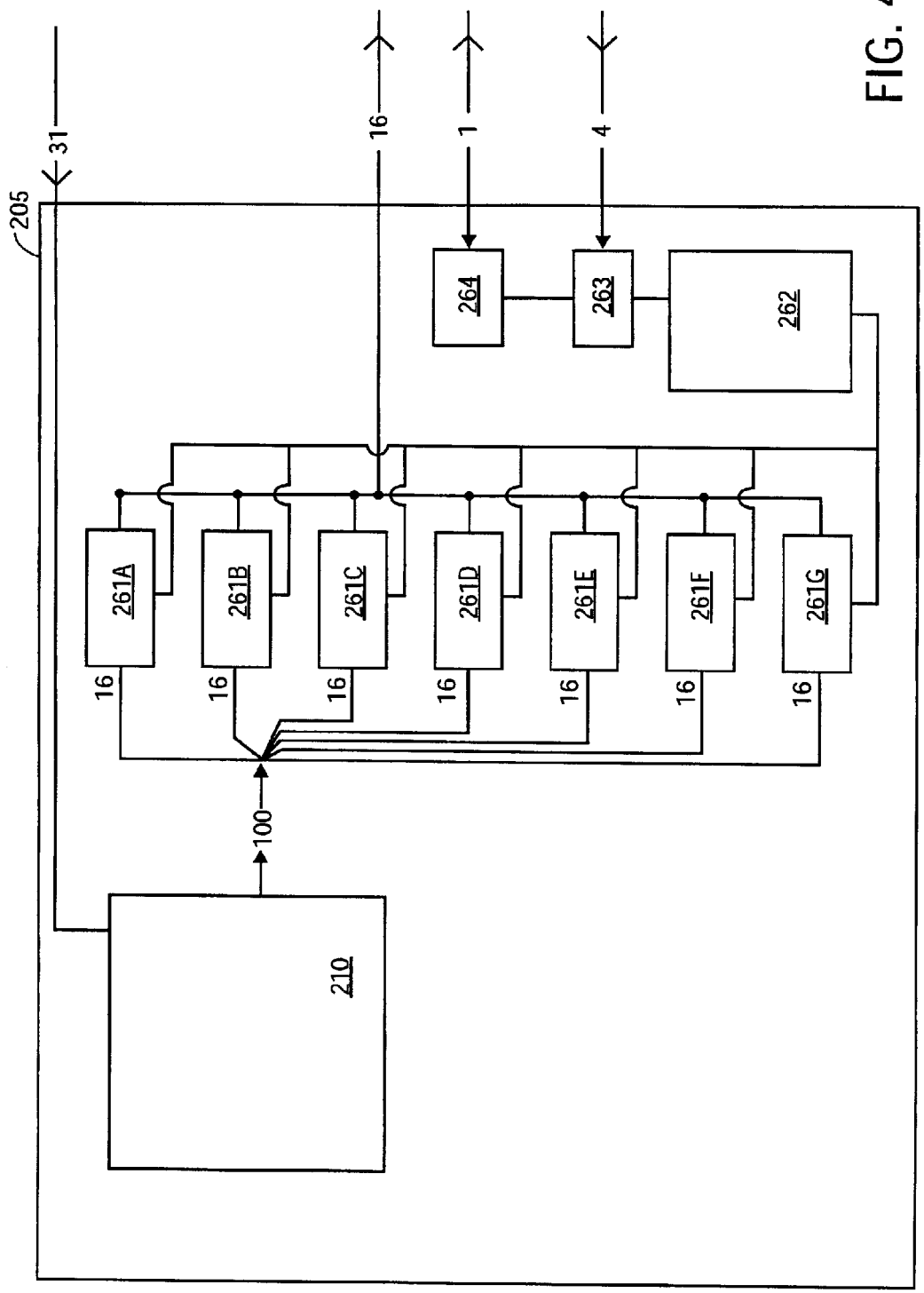
FIG. 4 illustrates, a BIB in accordance with one embodiment of the present invention

FIG. 4 illustrates the BIB 205 of FIG. 3 in greater detail. For example, there are 51 channels available for transmitting data between the driver board (not shown) and the BIB 205, of these 31 are used to drive control signals to the DUTs 210, leaving 20 channels available as monitoring channels to read the TDO signal of each of 100 DUTs. The 100 TDO signals are distributed among seven groups of switches 261a–261g, with, for example, 16 TDO signals going to each group of switches 261a–261f, and 4 TDO signals going to switch 261g. That is, the TDO signals from a number of distinct DUTs are sent to a particular group of switches.

The corresponding outputs of each of the group of switches 261a–261g are connected, and the programmable logic device (PLD) 262, comparators 263, and the divider 264 are used to select which group of switches will transmit its TDO signals to the driver board. That is, the driver firmware uses approximately 5 channels as control signals. Four channels are input to the comparators 263 and 1 channel is input to the divider 264. These 5 channels are used to indicate to PLD 262 which MUX to enable. Output level of these control signals is variable and depends on the type of DUTs on the BIB 205 and test conditions. To make the level of the control signals suitable for the PLD, independent of the output level of the driver's signal, the 4 control signals are connected to the input of the PUD through comparator 263. The reference voltage for comparator 263 is obtained from divider 264 by dividing the constant high logic level of the driver's output channel. For one embodiment, the PLD 262 is a complex PLD (CPLD), such as part number 5962-9952101QYA available from Cypress Semiconductor Corporation. The CPLD may be chosen based on size, cost, and temperature considerations.

When a particular group of switches is enabled, its TDO signals are transmitted to the driver board and the remaining groups of switches are disabled. The driver firmware is responsible for selecting which group is enabled, and is therefore aware of which DUTs correspond to each of the TDO signals it is receiving. The driver firmware selects each group of switches, in turn, until all TDO signals have been transmitted, and then repeats the monitoring process as required for the particular testing procedure.

Figure 5:
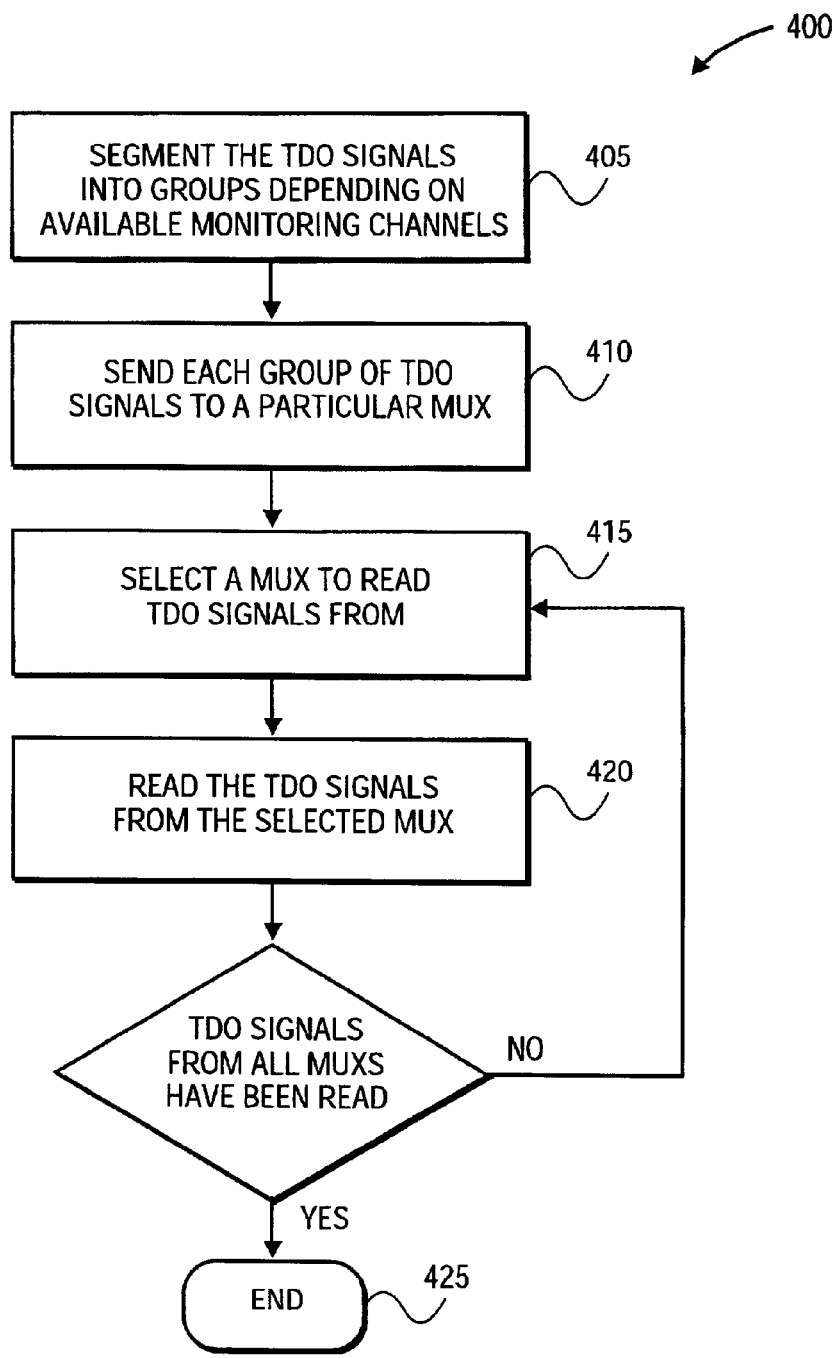
FIG. 5 illustrates a process flow diagram in accordance with one embodiment of the invention.

FIG. 5 illustrates a process flow diagram in accordance with one embodiment of the present invention. Process 400 begins at operation 405 in which the TDO signals from DUTs are segmented into groups depending on the number of available monitoring channels. For example, if there are 21 monitoring channels available and 100 DUTs to be tested, the 100 TDO signals may be segmented into groups of approximately 16 TDO signals. The number of TDO signals in each group depends on the number of monitoring channels available, and number of DUTs to be tested, and may be varied accordingly.

At operation 410 each group of TDO signals is sent to a particular group of switches. The corresponding output from each group of switches is shorted.

At operation 415 the driver firmware selects a particular group of switches. Upon selection, the selected group of switches is enabled while all remaining groups are disabled. The driver firmware effects this selection by sending control signals to a logic device located on the BIB as described above in reference to FIG. 4.

At operation 420 the driver firmware reads the TDO signals from the selected MUX. The driver firmware can determine from which DUT each of the TDO signals were transmitted from and therefore, can determine the particular DUTs, if any, that are failing. After the TDO signals from the selected group of switches have been read, the driver firmware signals the logic device on the BIB to select another group of switches.

If all the TDO signals from all the groups have been read, the process ends at operation 425 and is repeated periodically as required by the particular testing procedure.

The operation of segmenting the TDO signals into groups, sending each group to a particular group of switches, and selecting each group of switches, in turn, to be read, in accordance with an embodiment of the present invention, may be implemented by firmware within electronics 220 of driver board 215. Alternatively, such operations may be implemented by firmware and/or software contained within processing system 270. For example, processing system 270 may include one or more processors that can execute code or instructions stored within a machine-readable medium that may also be included within processing system 270.

The machine-readable medium may include a mechanism that provides (i.e., stores and/or transmits) information in a form readable by a machine such as computer or digital processing device. For example, a machine-readable medium may include a read only memory (ROM), random access memory (RAM), magnetic disk storage media, optical storage media, flash memory devices. The code or instructions may be represented by carrier-wave signals, infrared signals, digital signals, and by other like signals.

In the foregoing specification, methods and apparatuses for providing an increased capacity BIB have been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. An apparatus comprising:
a burn-in board coupled to a plurality of integrated circuit devices, each device having a test data output signal associated therewith, the burn-in board having a plurality of monitoring channels to transmit the test data output signal,
a plurality of groups of switches implemented on the burn-in board, each group of switches coupled to a corresponding portion of the plurality of integrated circuit devices such that each group of switches receives test data output signals associated with the portion of the plurality of integrated circuit devices corresponding thereto; and
a programmable logic device coupled to the plurality of groups of switches such that a specific group may be selected to transmit the test data output signals associated with the portion of the plurality of integrated circuit devices corresponding thereto via the plurality of monitoring channels.

2. The apparatus of claim 1, wherein the plurality of monitoring channels is less than the plurality of integrated circuit devices and the portion of the plurality of integrated circuit devices is less than the plurality of monitoring channels.

3. The apparatus of claim 1, further comprising:
a step-down power supply coupling the programmable logic device to a supply voltage, the step-down power supply accepting the supply voltage and outputting an operational voltage of the programmable logic device.

4. The apparatus of claim 3, wherein the plurality of multiplexors, the programmable logic device and the step-down power supply are capable of functioning at a temperature of 125° C.

5. The apparatus of claim 1, wherein the number of integrated circuits is 100 and the number of monitoring channels is 20.

6. The apparatus of claim 5, wherein the plurality of groups of switches comprises 7 groups of switches and the portion of integrated circuit devices corresponding to 6 of the 7 groups of switches comprises 16 integrated circuit devices and the portion of integrated circuit devices corresponding to 1 of the 7 groups of switches comprises 4 integrated circuit devices.

7. The apparatus of claim 6, wherein the burn-in board is compatible with a Reliability Criteria 18 burn-in oven.

8. The apparatus of claim 6, wherein the burn-in oven is a Reliability Criteria 18© burn-in oven.

9. The apparatus of claim 1, wherein at least one of the plurality of groups of switches, the programmable logic device, and the step-down power supply is coupled to a heat dissipation device.

10. The apparatus of claim 9, wherein the heat dissipation device is a heat sink.

11. A burn-in system comprising:
a burn-in oven having a test chamber;
a plurality of burn-in boards inserted into the test chamber, each burn-in board electrically connected to a plurality of integrated circuit devices;
a plurality of groups of switches disposed upon the burn-in board, each group of switches receiving a test data output signal from each of a designated portion of the integrated circuit devices;
a programmable logic device coupled to the plurality of group of switches;
a plurality of driver boards positioned outside the high temperature chamber, each driver board coupled to a corresponding burn-in board, the driver board transmitting control signals to the programmable logic device to enable a selected group of switches such that the selected group of switches transmits the received test data output signals via a plurality of monitoring channels.

12. The apparatus of claim 11, wherein the plurality of monitoring channels is less than the plurality of integrated circuit devices and the portion of the plurality of integrated circuit devices is less than the plurality of monitoring channels.

13. The apparatus of claim 12, further comprising:

a step-down power supply coupling the programmable logic device to a supply voltage, the step-down power supply accepting the supply voltage and outputting an operational voltage of the plurality of the programmable logic device.

14. The apparatus of claim 13, wherein each of the plurality of driver boards is coupled to a processing system through which a user may adjust firmware implemented on the driver board to effect the selection of the plurality of groups of switches.

15. The apparatus of claim 14, wherein the firmware is implemented on a field-programmable gate array.

16. The apparatus of claim 13, wherein the plurality of groups of switches, the programmable logic device and the step-down power supply are capable of functioning at a temperature of 125° C.

* * * * *